(12) United States Patent
Ichihara et al.

(10) Patent No.: US 9,305,646 B2
(45) Date of Patent: Apr. 5, 2016

(54) SEMICONDUCTOR MEMORY DEVICE

(71) Applicant: KABUSHIKI KAISHA TOSHIBA, Minato-ku (JP)

(72) Inventors: Reika Ichihara, Yokohama (JP); Shosuke Fujii, Kuwana (JP); Hidenori Miyagawa, Yokkaichi (JP); Takayuki Ishikawa, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/444,350

(22) Filed: Jul. 28, 2014

(65) Prior Publication Data
US 2015/0078063 A1 Mar. 19, 2015

(30) Foreign Application Priority Data

Sep. 18, 2013 (JP) ................................ 2013-193540

(51) Int. Cl.
*G11C 11/16* (2006.01)
*G11C 13/00* (2006.01)
*H01L 45/00* (2006.01)

(52) U.S. Cl.
CPC ........ *G11C 13/0069* (2013.01); *G11C 13/0007* (2013.01); *H01L 45/1253* (2013.01); *G11C 2013/0083* (2013.01); *G11C 2013/0092* (2013.01); *G11C 2213/33* (2013.01); *G11C 2213/55* (2013.01)

(58) Field of Classification Search
CPC ............................ G11C 11/16; G11C 13/0069

USPC .................................................. 365/148, 158
See application file for complete search history.

(56) References Cited

U.S. PATENT DOCUMENTS

| 8,320,157 | B2 | 11/2012 | Ichihara et al. | |
|---|---|---|---|---|
| 2011/0103139 | A1 | 5/2011 | Kau et al. | |
| 2011/0182109 | A1* | 7/2011 | Ikeda et al. | 365/148 |
| 2012/0068144 | A1* | 3/2012 | Fujitsuka et al. | 257/4 |
| 2012/0250394 | A1 | 10/2012 | Ichihara et al. | |
| 2013/0010529 | A1 | 1/2013 | Hayakawa et al. | |
| 2013/0122651 | A1* | 5/2013 | Fujii et al. | 438/104 |
| 2014/0112055 | A1* | 4/2014 | Kawahara et al. | 365/148 |

FOREIGN PATENT DOCUMENTS

| JP | 2012-212477 | 11/2012 |
|---|---|---|
| JP | 5144840 | 11/2012 |

* cited by examiner

*Primary Examiner* — Michael Tran
(74) *Attorney, Agent, or Firm* — Oblon, McClelland, Maier & Neustadt, L.L.P.

(57) ABSTRACT

A semiconductor memory device according to an embodiment comprises a memory cell and a control circuit, the control circuit performing write of data to the memory cell. The memory cell includes a second resistance varying layer sandwiched between a first resistance varying layer and a third resistance varying layer. The second resistance varying layer has a resistance value which is smaller than that of the other resistance varying layers. The control circuit applies to the memory cell a first voltage pulse, and then applies to the memory cell a second voltage pulse that has a rise time which is shorter than that of the first voltage pulse.

10 Claims, 10 Drawing Sheets

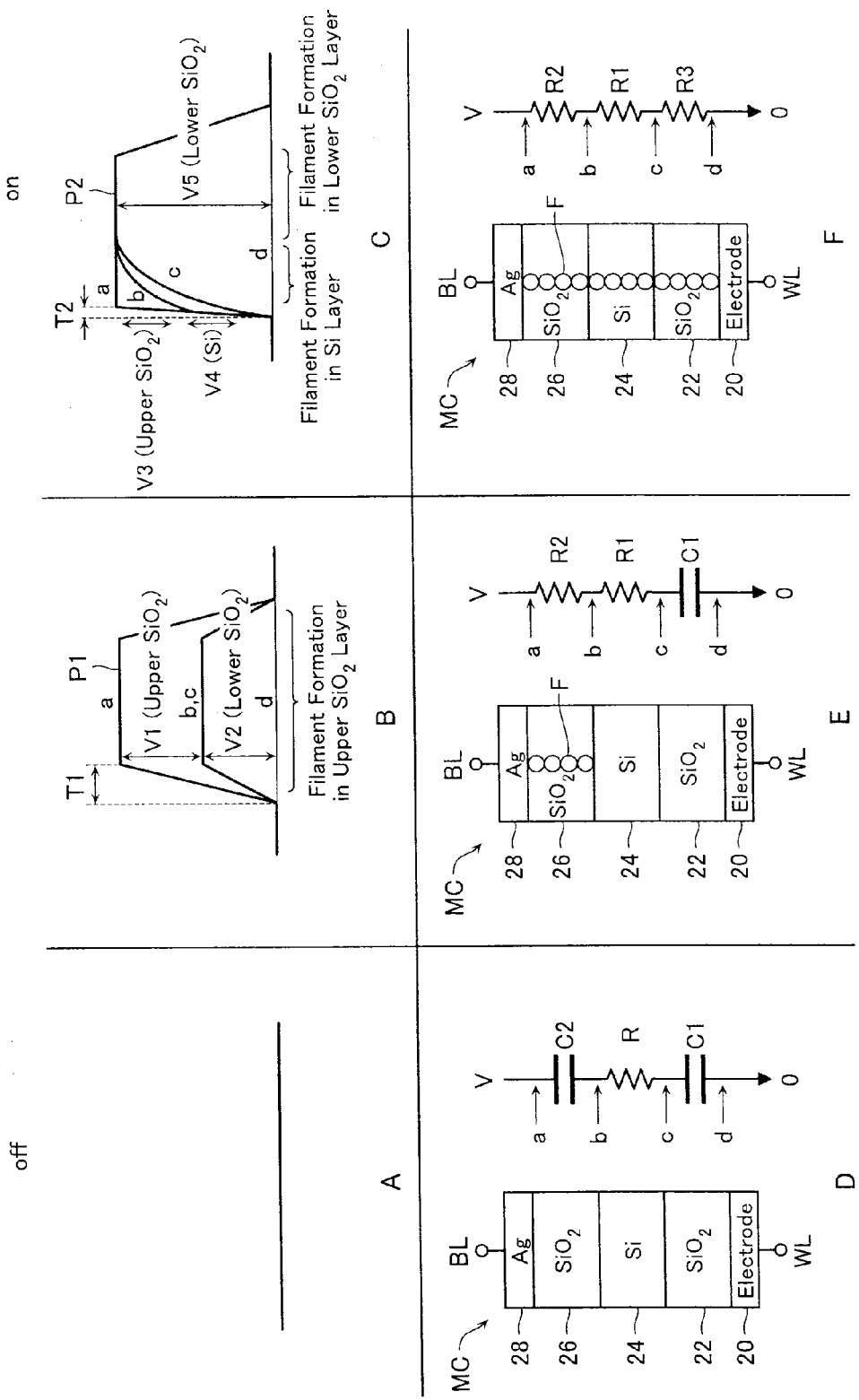

SEMICONDUCTOR MEMORY DEVICE

CROSS REFERENCE TO RELATED APPLICATIONS

This application is based on and claims the benefit of priority from prior Japanese Patent Application No. 2013-193540, filed on Sep. 18, 2013, the entire contents of which are incorporated herein by reference.

FIELD

Embodiments described in the present specification relate to a semiconductor memory device.

BACKGROUND

Conventionally, there has been proposed a semiconductor memory device that includes a variable resistance element whose resistance value changes by application of a voltage. The variable resistance element can have its resistance value lowered by a setting operation (write operation), and can have its resistance value raised by a resetting operation (erase operation).

BRIEF DESCRIPTION OF THE DRAWINGS

FIG. 4 includes views showing a method of application of a voltage pulse of the semiconductor memory device according to the first embodiment.

DETAILED DESCRIPTION

A semiconductor memory device according to an embodiment comprises a memory cell and a control circuit, the control circuit performing write of data to the memory cell. The memory cell includes: a first electrode; a first resistance varying layer formed on the first electrode; a second resistance varying layer formed on the first resistance varying layer and having a resistance value which is smaller than that of the first resistance varying layer; a third resistance varying layer formed on the second resistance varying layer and having a resistance value which is larger than that of the second resistance varying layer; and a second electrode formed on the third resistance varying layer. The control circuit applies to the memory cell a first voltage pulse, and then applies to the memory cell a second voltage pulse that has a polarity which is identical to that of the first voltage pulse and that has a rise time which is shorter than that of the first voltage pulse.

A nonvolatile semiconductor memory device according to embodiments of the present invention will be described below with reference to the drawings.

First Embodiment

Figure 1:
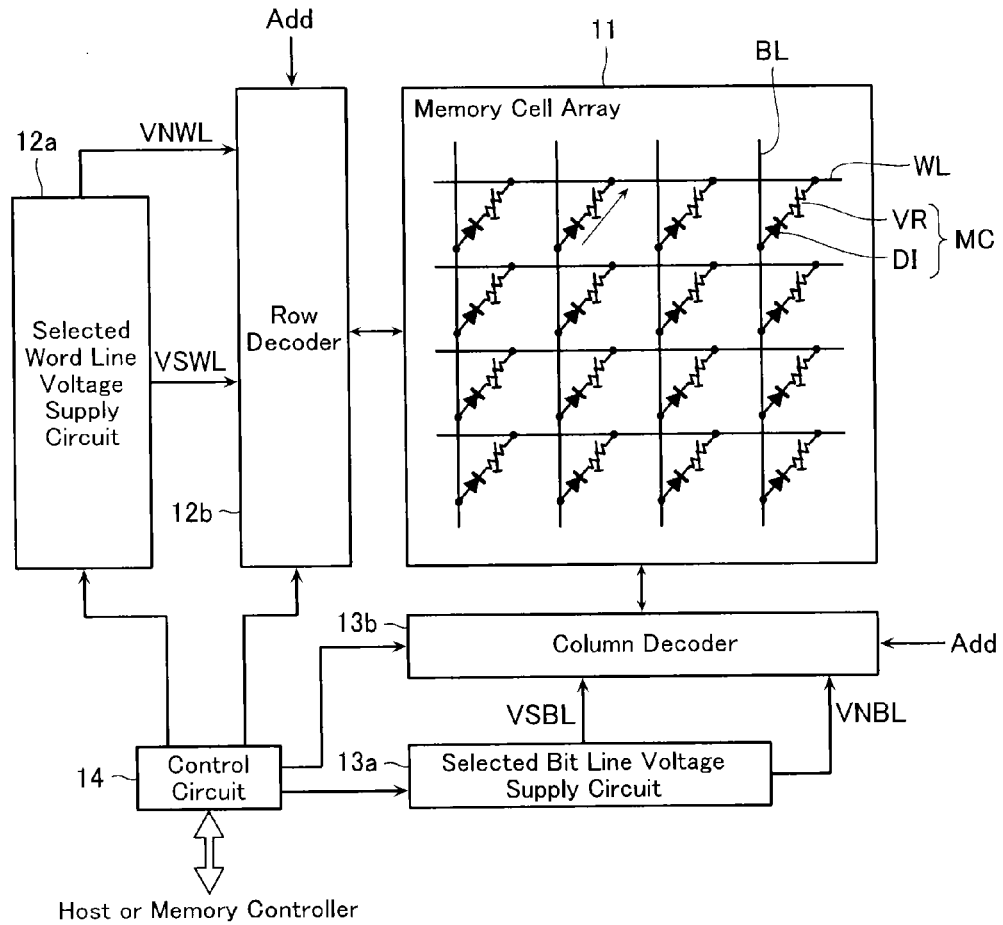
FIG. 1 is a block diagram showing a semiconductor memory device according to a first embodiment.

FIG. 1 is a block diagram showing a semiconductor memory device according to a first embodiment. As shown in FIG. 1, the semiconductor memory device comprises a memory cell array 11, a selected word line voltage supply circuit 12a, a row decoder 12b, a selected bit line voltage supply circuit 13a, a column decoder 13b, and a control circuit 14. In addition, the semiconductor memory device operates on receiving a setting command, a resetting command, an address, and so on, from a host or memory controller not illustrated.

The memory cell array 11 includes a plurality of word lines WL and a plurality of bit lines BL that intersect each other, and a memory cell MC disposed at each of intersections of the word lines WL and the bit lines BL. The memory cell MC includes a diode DI and a variable resistance element VR that are connected in series. The diode DI is provided for preventing a sneak current when the memory cell MC is electrically accessed. In the present embodiment, a forward direction of the diode DI is assumed to be a direction from the bit line BL toward the word line WL. The memory cell MC may be configured from a variable resistance element that has a diode function built in thereto.

The selected word line voltage supply circuit 12a supplies a selected word line voltage VSWL and a non-selected word line voltage VNWL to the row decoder 12b, and the selected bit line voltage supply circuit 13a supplies a selected bit line voltage VSBL and a non-selected bit line voltage VNBL to the column decoder 13b. The control circuit 14 controls the selected word line voltage supply circuit 12a, the row decoder 12b, the selected bit line voltage supply circuit 13a, and the column decoder 13b, according to a command inputted from external.

The row decoder 12b and the column decoder 13b each have an address signal Add provided thereto. The row decoder 12b supplies the selected word line voltage VSWL to a selected word line WL and supplies the non-selected word line voltage VNWL to a non-selected word line WL, based on the address signal Add. The column decoder 13b supplies the selected bit line voltage VSBL to a selected bit line BL and supplies the non-selected bit line voltage VNBL to a non-selected bit line BL, based on the address signal Add. As a result, the selected word line WL and the selected bit line BL have certain voltages applied thereto, and a setting operation or a resetting operation are executed on the memory cell MC.

Now, the setting operation is an operation for causing the variable resistance element VR in the memory cell MC to undergo transition from a high-resistance state (reset state) to a low-resistance state (set state), and corresponds to a data write operation. The resetting operation is an operation for causing the variable resistance element VR in the memory cell MC to undergo transition from the low-resistance state (set state) to the high-resistance state (reset state), and corresponds to a data erase operation.

Figure 2:
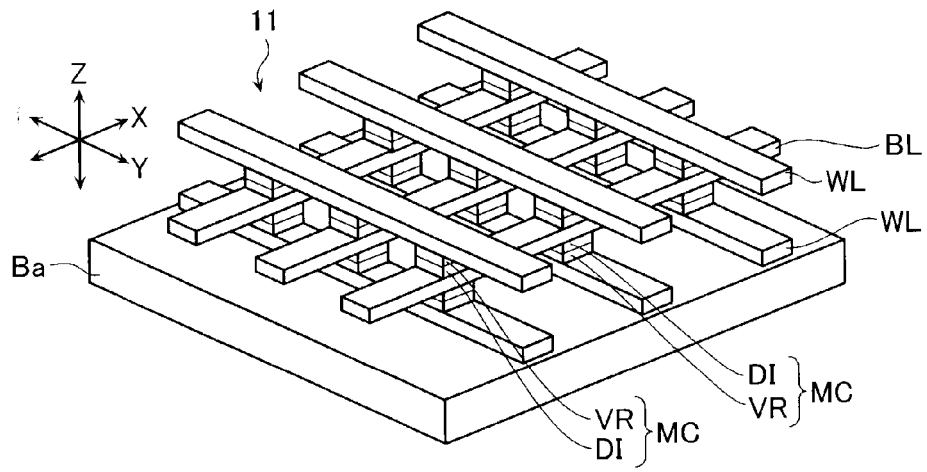
FIG. 2 is a perspective view showing a memory cell array of the semiconductor memory device according to the first embodiment.

FIG. 2 is a perspective view showing the memory cell array. The word lines WL are disposed with a certain pitch in an X direction parallel to a semiconductor substrate Ba, and extend in a Y direction. The bit lines BL are disposed with a certain pitch in the Y direction, and extend in the X direction, so as to intersect the word lines WL. The memory cell MC is provided between the word line WL and the bit line BL in a region where the word line WL and the bit line BL intersect. The memory cells MC aligned in a Z direction orthogonal to the semiconductor substrate Ba share the bit line BL which is in between them.

The bit line BL and the word line WL are preferably of a material which is heat-resistant and of low resistivity, and are configured from, for example, tungsten (W), titanium (Ti), tantalum (Ta), and their nitrides, or stacked arrangements of these metals and nitrides. The bit lines BL and the word lines WL have their line width and line spacing each set at 20 nm, and are disposed with a pitch of 40 nm, for example.

Figure 3A:
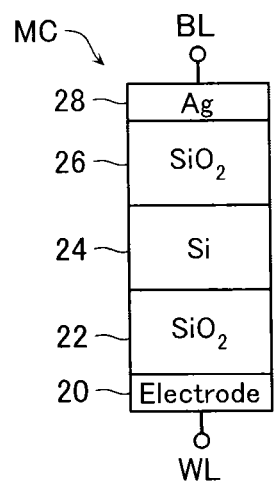
FIGS. 3A and 3B are views showing a memory cell of the semiconductor memory device according to the first embodiment.
Figure 3B:
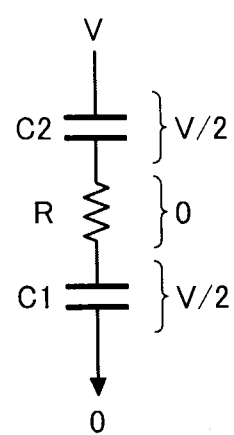

FIG. 3 is a view showing the memory cell MC. FIG. 3A is a schematic view of the memory cell, and FIG. 3B is a view showing schematically each layer substituted by a circuit element. As shown in FIG. 3A, the memory cell MC is configured having stacked therein, sequentially from a side of the word line WL, a lower electrode layer 20, a lower $SiO_2$ layer 22, a Si layer 24, an upper $SiO_2$ layer 26, and a Ag layer 28.

The lower electrode layer 20 is an example of a first electrode, and in the present embodiment, is connected to the word line WL. Employable in the lower electrode layer 20 are, for example, silicon (Si) doped with an impurity, tungsten (W), titanium (Ti), tantalum (Ta), and compounds of these ($TiN_x$, $TiSi_x$, $TiSi_xN_y$, $TaN_x$, and $TaSi_xN_y$). Moreover, it is also possible for a stacked structure of the above-described elemental substances and compounds to be employed in the lower electrode layer 20.

The lower $SiO_2$ layer 22 is an example of a first resistance varying layer formed on the first electrode, and includes $SiO_2$. The Si layer 24 is an example of a second resistance varying layer formed on the first resistance varying layer and having a resistance value which is smaller than that of the first resistance varying layer, and includes Si. The upper $SiO_2$ layer 26 is an example of a third resistance varying layer formed on the second resistance varying layer and having a resistance value which is larger than that of the second resistance varying layer, and includes $SiO_2$. In this way, the memory cell MC in the present embodiment has a configuration in which the Si layer 24 of low resistance is sandwiched by the lower $SiO_2$ layer 22 and upper $SiO_2$ layer 26 of high resistance. Note that "resistance value" in the above description is assumed to refer to a resistance value in respective OFF states (the same applies in the description below).

The Ag layer 28 is an example of a second electrode formed on the third resistance varying layer, and in the present embodiment, is connected to the bit line BL. The Ag layer 28 is configured from a material including Ag, and as will be mentioned later, supplies a Ag filament formed in the lower $SiO_2$ layer 22, the Si layer 24, and the upper $SiO_2$ layer 26. The Ag layer 28 may have further stacked therein silicon (Si) doped with an impurity, tungsten (W), titanium (Ti), tantalum (Ta), and compounds of these ($TiN_x$, $TiSi_x$, $TiSi_xN_y$, $TaN_x$, and $TaSi_xN_y$).

As shown in FIG. 3B, according to an equivalent circuit of the memory cell MC, the Si layer 24 of low resistance may be represented by a resistance R, and the lower $SiO_2$ layer 22 and the upper $SiO_2$ layer 26 of high resistance may be represented by capacitors C1 and C2, respectively. In the setting operation during data write, the word line WL and the bit line BL are applied with a low voltage (for example, 0 [V]) and a high voltage (for example, V [V]), respectively. As a result, the lower $SiO_2$ layer 22 (C1) and the upper $SiO_2$ layer 26 (C2) of high resistance are each applied with a voltage of V/2, but the Si layer 24 (R) of low resistance is applied with almost no voltage.

In the semiconductor memory device in the present embodiment, there is a configuration in which write of data (the setting operation) is performed by applying a voltage to the memory cell MC to form a Ag filament in a resistance varying layer and thereby lower a resistance of the memory cell MC. However, as shown in FIG. 3B, in the stacked type memory cell MC, there is a problem that the Si layer 24 of low resistance sandwiched by layers of high resistance does not have a sufficient voltage applied thereto, and it is difficult for filament formation to be performed therein. Moreover, in the case of adopting a configuration where a high voltage is applied in order to form a sufficient filament, destruct ion or deterioration of an element sometimes ends up occurring. In the description below, a semiconductor memory device capable of solving the above problem will be described.

FIG. 4 includes views showing a method of application of a voltage pulse during data write (the setting operation). FIGS. 4"A" to "C" are waveform diagrams showing a change in potential at each of nodes (a, b, c, and d) in the memory cell MC during voltage pulse application, of which a graph of "a" matches a waveform of a pulse applied to the memory cell MC. FIGS. 4"D" to "F" show, by means of a schematic diagram and an equivalent circuit diagram, a state of the memory cell MC during the voltage pulse application of FIGS. 4"A" to "C", respectively. Control shown in FIG. 4 is executed by, for example, the selected word line voltage supply circuit 12a, the row decoder 12b, the selected bit line voltage supply circuit 13a, the column decoder 13b, and the control circuit 14. In the description below, the above circuits are sometimes referred to collectively as a "control circuit".

First, in an initial state shown in FIGS. 4"A" and "D", a voltage pulse is not applied to the memory cell MC, and the lower $SiO_2$ layer 22, the Si layer 24, and the upper $SiO_2$ layer 26 that are the resistance varying layers do not have a filament formed therein. Therefore, the equivalent circuit diagram is the same as that shown in FIG. 3B, and has a configuration in which the resistance R of a low-resistance layer is sandwiched by the capacitors C1 and C2 of high-resistance layers.

Next, as shown in FIG. 4"B", the control circuit applies a first voltage pulse P1 to the memory cell MC. A polarity of the first voltage pulse P1 is configured such that an upper $SiO_2$ layer 26 side is at a high potential and a lower $SiO_2$ layer 22 side is at a low potential, and a rise time of the pulse is T1. The first voltage pulse P1 is configured such that the rise time T1 is comparatively long and gradual, hence changes in potential of the node b and the node c are substantially equal, and almost no voltage is applied between the nodes b and c. Now, rise time of the pulse is assumed to refer to a time until a pulse voltage reaches 90 percent of its maximum voltage from 0 V.

As a result, the upper $SiO_2$ layer 26 and the lower $SiO_2$ layer 22 are applied with V1 (upper $SiO_2$) corresponding to a potential difference between the nodes a and b, and V2 (lower $SiO_2$) corresponding to a potential difference between the nodes c and d, respectively. As a result, as shown in FIG. 4"E", formation of a filament F is performed in the upper $SiO_2$ layer 26 close to the Ag layer 28, and the upper $SiO_2$ layer 26 has its resistance lowered. In the equivalent circuit of FIG. 4"E", the Si layer 24 which is low resistance from the start and the upper $SiO_2$ layer 26 which has had its resistance lowered by the first voltage pulse P1 are indicated by R1 and R2, respectively.

Next, as shown in FIG. 4"C", the control circuit applies a second voltage pulse P2 to the memory cell MC. A polarity of the second voltage pulse P2 is configured the same as that of the first voltage pulse P1, namely such that the upper $SiO_2$ layer 26 side is at a high potential and the lower $SiO_2$ layer 22 side is at a low potential, but a rise time T2 of the pulse is shorter compared to the rise time T1 of the first voltage pulse P1. In this way, the second voltage pulse P2 is configured such that the rise time T2 is comparatively short and steep, hence a difference occurs in the changes in potential of the node b and the node c.

As a result, in an initial stage of the second voltage pulse P2, the upper $SiO_2$ layer 26 and the Si layer 24 are applied with V3 (upper $SiO_2$) corresponding to a potential difference between the nodes a and b, and V4 (Si) corresponding to a potential difference between the nodes b and c, respectively. As a result, as shown in FIG. 4"F", formation of the filament F is performed in the Si layer 24.

Furthermore, when a fixed time passes after applying the second voltage pulse P2, charging to the lower $SiO_2$ layer 22 which is a capacitor proceeds, and a voltage applied to the lower $SiO_2$ layer 22 increases. The voltage applied to the lower $SiO_2$ layer 22 is V5 (lower $SiO_2$) corresponding to a potential difference between the nodes c and d, and eventually becomes substantially equal to a potential difference of the second voltage pulse P2. As a result, as shown in FIG. 4"F", formation of the filament F is performed also in the lower $SiO_2$ layer 22, and the lower $SiO_2$ layer 22 has its resistance lowered. In the equivalent circuit of FIG. 4"F", the lower $SiO_2$ layer 22 which has had its resistance lowered is indicated by R3.

As described above, due to the semiconductor memory device according to the first embodiment, the control circuit applies to the memory cell MC the first voltage pulse P1 having a comparatively gentle rise, and then applies to the memory cell MC the second voltage pulse P2 having a rise time which is shorter and steeper than that of the first voltage pulse P1. As a result, the Si layer 24 which is low resistance can have a voltage sufficient for filament formation applied thereto during application of the second voltage pulse P2. As a result, the setting operation (write operation) can be performed efficiently in the stacked type memory cell MC. Moreover, filament formation at a comparatively low voltage is enabled, hence destruction of an element due to application of a high voltage can be suppressed.

Figure 5:
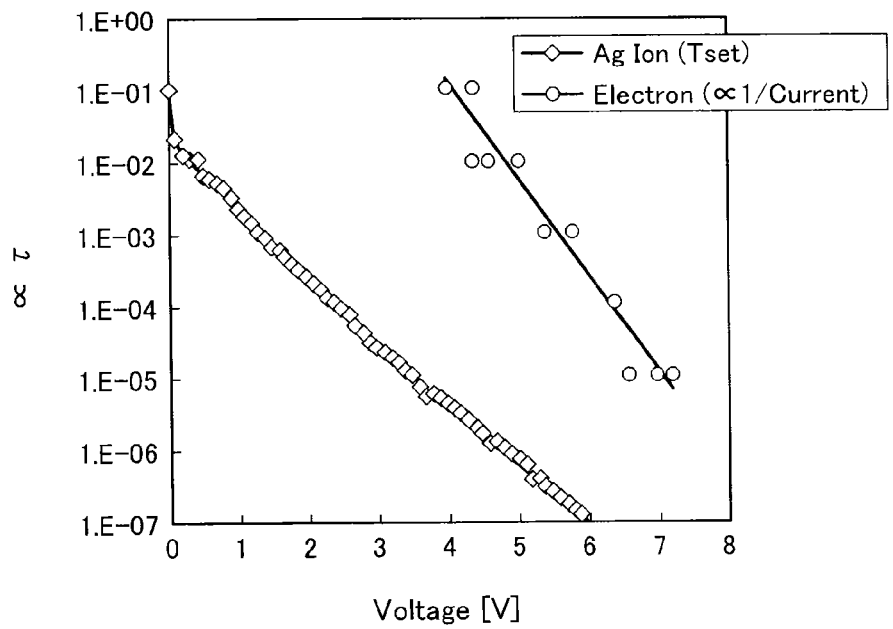
FIG. 5 is a graph showing a relationship between an electron current and time required for a fixed amount of movement of Ag ions in a Si layer of the semiconductor memory device according to the first embodiment.

FIG. 5 is a graph showing an voltage and time required for a fixed amount of Ag ion movement in the Si layer 24(τ). The horizontal axis and the vertical axis show, respectively, an applied voltage (Voltage [V]) and τ. Regardless of whether the rise of the voltage pulse is steep or not, the same amount (C×V) of electrons flows in a resistance portion (R1) until a steady state is attained. Therefore, if it is supposed that voltage dependency of the electron current and the amount of Ag ion movement in the resistance portion are equal, then the amount of Ag ions moving until a steady state is attained should be the same, regardless of steepness of the rise of the voltage pulse.

However, in reality, as shown in FIG. 5, the amount of Ag ion movement has a larger voltage dependency compared to the electron current. Therefore, by steepening the rise of the voltage pulse and providing a high voltage to the Si layer 24 even for a short time, the amount of movement of Ag ions can be increased. As a result, it can be made easier to perform formation of the Ag filament in the Si layer 24. As described above, the graph of FIG. 5 supports the fact that formation of the filament in the Si layer 24 can be promoted by applying the second voltage pulse P2 having a steep rise.

Figure 6:
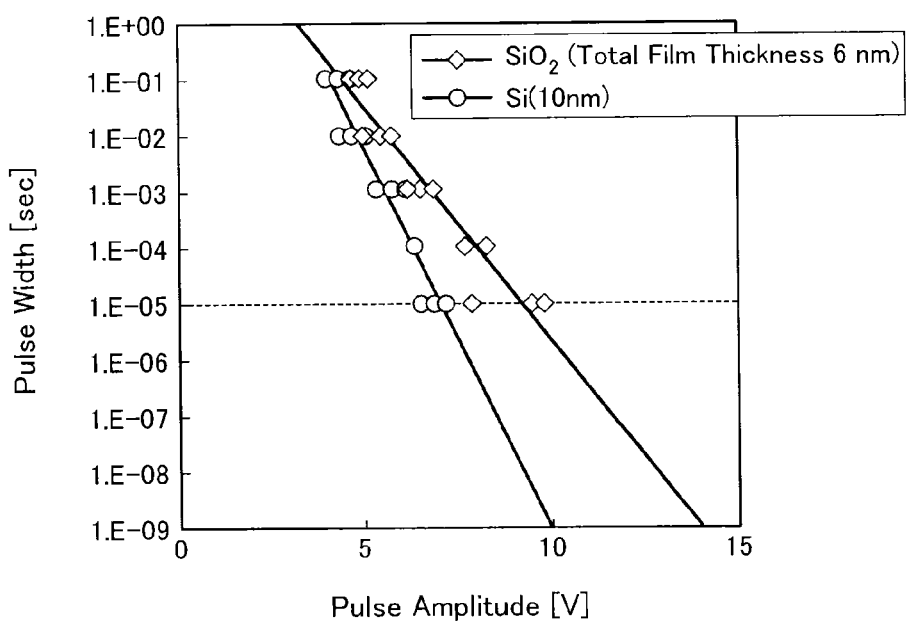
FIG. 6 is a graph showing a relationship between a voltage required for filament growth and application time in a Si layer of the semiconductor memory device according to the first embodiment.

FIG. 6 is a graph showing a relationship between a voltage required for filament growth and application time of the voltage. The horizontal axis and the vertical axis show, respectively, magnitude of the pulse (Pulse Amplitude [V]) and pulse width (Pulse Width [sec]). Now, pulse width is a time from a time point when a pulse voltage during rise thereof attains 50 percent of its maximum voltage to a time point when the pulse voltage during fall thereof attains 50 percent of its maximum voltage. As illustrated, the Si layer has a voltage required for filament growth and an application time that are smaller compared to the $SiO_2$ layer. Therefore, formation of a sufficient filament can be performed even with a short rise time T2 (for example, 10 [ns] or less), as in the second voltage pulse P2.

Considering the above, the second voltage pulse P2 preferably has a rise time enabling a filament to be formed in the Si layer 24 and a pulse width enabling a filament to be formed in the lower $SiO_2$ layer 22.

Figure 7:
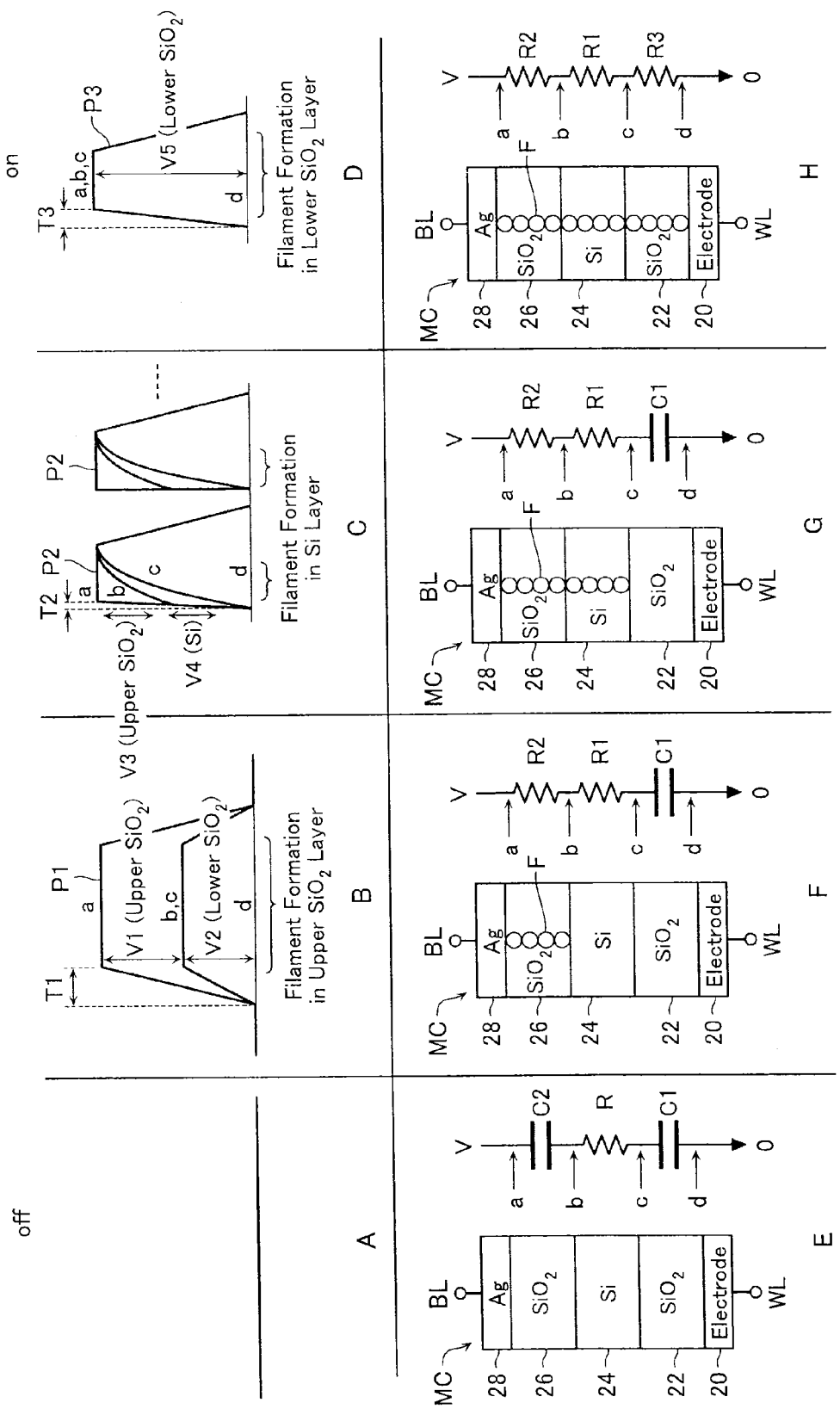
FIG. 7 includes views showing a method of application of a voltage pulse according to a first modified example of the semiconductor memory device according to the first embodiment.

FIG. 7 includes views showing a method of application of a voltage pulse of a semiconductor memory device according to a first modified example. FIGS. 7"A" to "D" are waveform diagrams showing a change in potential at each of nodes (a, b, c, and d) in the memory cell MC during voltage pulse application, and FIGS. 7"E" to "H" each include a schematic diagram and an equivalent circuit diagram showing a state of the memory cell MC during the voltage pulse application. A process up to that of formation of the filament F in the upper $SiO_2$ layer 26 shown in FIGS. 7"A" to "B" and FIGS. 7"E" to "F" is shared with FIG. 4 (first embodiment), hence a detailed description thereof will be omitted.

As shown in FIG. 7"C", in the first modified example, the control circuit applies the second voltage pulse P2 a plurality of times, successively. Now, "successively" refers to successive application of the second voltage pulse P2 only, without application of a voltage pulse of another waveform being sandwiched in between. At this time, the second voltage pulse P2 need only have a voltage and pulse width enabling the filament to be formed in the Si layer 24, and need not have a pulse width enabling the filament to be formed in the lower $SiO_2$ layer 22. In other words, the pulse width of the second voltage pulse P2 in the first modified example may be shorter than the pulse width of the second voltage pulse P2 in the first embodiment.

Next, as shown in FIG. 7"D", in the first modified example, the control circuit applies a third voltage pulse P3 to the memory cell MC. A rise time T3 of the third voltage pulse P3 is preferably longer compared to the rise time T2 of the second voltage pulse P2. This is because there is a risk that if the rise time T3 is short, then the rise of the third voltage pulse P3 becomes steep and an unnecessary high voltage is applied to the upper SiO$_2$ layer 26 and the Si layer 24 where the filament F has already been formed. As shown in FIG. 7"G", the upper SiO$_2$ layer 26 and the Si layer 24 already have the filament F formed therein and have their resistance lowered. Therefore, as shown in FIG. 7"D", substantially all of a voltage of the third voltage pulse P3 is distributed to the lower SiO$_2$ layer 22 (between the nodes c and d). As a result, as shown in FIG. 7"H", formation of the filament F is performed in the lower SiO$_2$ layer 22, and the lower SiO$_2$ layer 22 has its resistance lowered.

Due to the first modified example, the control circuit applies the second voltage pulse P2 a plurality of times, successively, thereby enabling formation of the filament in the Si layer 24 to be more reliably performed. In addition, after having applied the second voltage pulse P2, the control circuit performs application of the third voltage pulse P3 having a rise time which is long, thereby enabling formation of the filament in the lower SiO$_2$ layer 22 to be performed without an unnecessary voltage being applied to the upper SiO$_2$ layer 26 and the Si layer 24. Note that formation of the filament need not be performed in the lower SiO$_2$ layer 22 during application of the second voltage pulse P2, hence preferably the pulse width of the second voltage pulse P2 is reduced and the write time shortened.

Figure 8:
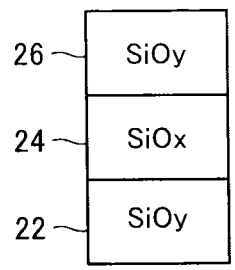
FIG. 8 is a view showing a memory cell according to a second modified example of the semiconductor memory device according to the first embodiment.

FIG. 8 is a view showing a memory cell according to a second modified example. Only a configuration of the memory cell MC related to the resistance varying layers is shown, and illustration of other configurations is omitted. The first embodiment employed, respectively, the lower SiO$_2$ layer 22 as an example of the first resistance varying layer, the Si layer 24 as an example of the second resistance varying layer, and the upper SiO$_2$ layer 26 as an example of the third resistance varying layer, but a specific form of the memory cell MC is not limited to this configuration. For example, as shown in FIG. 8, it is possible to employ a SiO$_y$ layer as the first resistance varying layer and the third resistance varying layer of high resistance and to employ a SiO$_x$ layer as the second resistance varying layer of low resistance sandwiched in between. At this time, the first resistance varying layer and the third resistance varying layer are configured as layers having an oxygen concentration which is higher compared to that of the second resistance varying layer, such that a relationship of "x<y" holds. Moreover, in a memory cell MC having a stacked structure using three layers of resistance varying layers, it is also possible to employ materials other than indicated in the present embodiment and the modified examples, provided the memory cell MC is configured having a low-resistance layer sandwiched between two high-resistance layers.

Second Embodiment

Next, a second embodiment will be described. The second embodiment is an example adopting a two-layer structure of resistance varying layers of the memory cell MC. An overall configuration of the second embodiment and a configuration of the memory cell array 11 are shared with the configuration of the first embodiment shown in FIGS. 1 and 2.

Figure 9A:
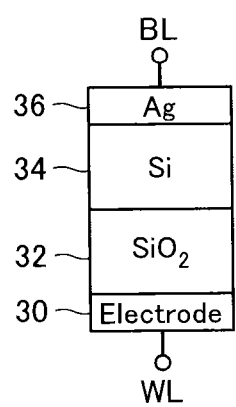
FIGS. 9A and 9B are views showing a memory cell of a semiconductor memory device according to a second embodiment.
Figure 9B:
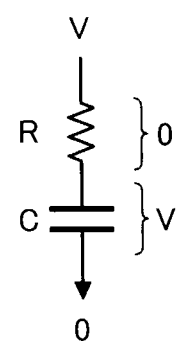

FIG. 9 is a view showing the memory cell according to the second embodiment. FIG. 9A is a schematic view of the memory cell, and FIG. 9B is a view showing schematic schematically each layer substituted by a circuit element. As shown in FIG. 9A, the memory cell MC is configured having stacked therein, sequentially from a side of the word line WL, a lower electrode layer 30, a SiO$_2$ layer 32, a Si layer 34, and a Ag layer 36. In this way, the second embodiment differs from the first embodiment in having a two-layer structure of resistance varying layers of the memory cell MC.

The SiO$_2$ layer 32 is an example of the first resistance varying layer formed on the first electrode, and includes SiO$_2$. The Si layer 34 is an example of the second resistance varying layer formed on the first resistance varying layer and having a resistance value which is smaller than that of the first resistance varying layer, and includes Si. In the equivalent circuit of FIG. 9B, a region corresponding to the Si layer 34 of low resistance is represented by a resistance R, and a region corresponding to the SiO$_2$ layer 32 of high resistance is represented by a capacitor C. Other configurations are generally shared with the first embodiment, and a detailed description thereof is omitted.

Figure 10:
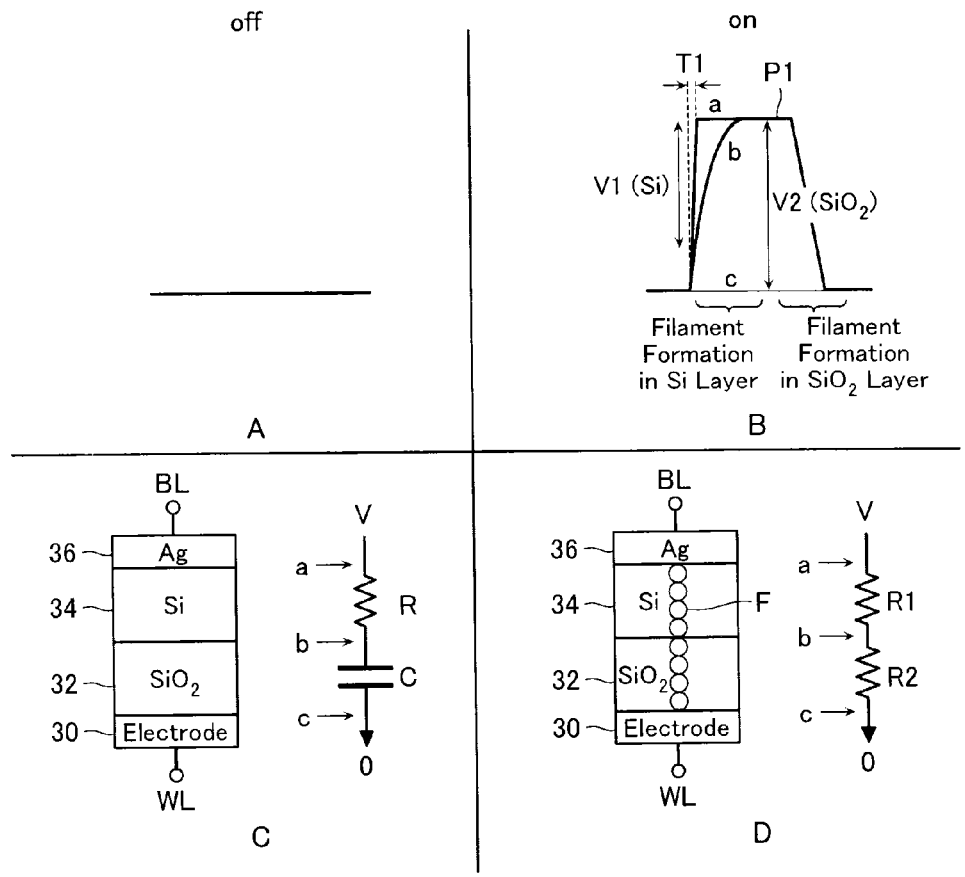
FIG. 10 includes views showing a method of application of a voltage pulse of the semiconductor memory device according to the second embodiment.

FIG. 10 includes views showing a method of application of a voltage pulse. FIGS. 10"A" to "B" are waveform diagrams showing a change in potential at each of nodes (a, b, and c) in the memory cell MC during voltage pulse application, of which a graph of "a" matches a waveform of a pulse applied to the memory cell MC. FIGS. 10"C" to "D" show, by means of a schematic diagram and an equivalent circuit diagram, a state of the memory cell MC during the voltage pulse application of FIGS. 10"A" to "B", respectively.

First, in an initial state shown in FIGS. 10"A" and "C", a voltage pulse is not applied to the memory cell MC, and the SiO$_2$ layer 32 and the Si layer 34 that are the resistance varying layer do not have a filament formed therein. Therefore, the equivalent circuit diagram too is similar to that shown in FIG. 9B.

Next, as shown in FIG. 10"B", the control circuit applies a first voltage pulse P1 to the memory cell MC. A polarity of the first voltage pulse P1 is configured such that a Si layer 34 side is at a high potential and a SiO$_2$ layer 32 side is at a low potential. Now, a rise time T1 of the first voltage pulse P1 is configured as a short time corresponding to the rise time T2 of the second voltage pulse P2 in the first embodiment. Therefore, a difference occurs in the changes in potential of the node a and the node b.

As a result, in an initial stage of the first voltage pulse P1, the Si layer 34 is applied with V1 (Si) corresponding to a potential difference between the nodes a and b. As a result, as shown in FIG. 10"D", formation of a filament F is performed in the Si layer 34.

Furthermore, when a fixed time passes after applying the first voltage pulse P1, charging to the SiO$_2$ layer 32 which is a capacitor proceeds, and a voltage applied to the SiO$_2$ layer 32 increases. The voltage applied to the SiO$_2$ layer 32 is V2 (SiO$_2$) corresponding to a potential difference between the nodes b and c, and eventually becomes substantially equal to a potential difference of the first voltage pulse P1. As a result, as shown in FIG. 10"D", formation of the filament F is performed also in the SiO$_2$ layer 32, and the SiO$_2$ layer 32 has its resistance lowered. In the equivalent circuit of FIG. 10"D", the Si layer 34 which is low resistance from the start and the SiO$_2$ layer 32 which has had its resistance lowered by the first voltage pulse P1 are indicated by R1 and R2, respectively.

In the above-described second embodiment, contrary to in the first embodiment, there is no voltage pulse representing a target for comparison of the first voltage pulse. Accordingly, a preferable rise time of the first voltage pulse P1 will be further discussed.

Figure 11:
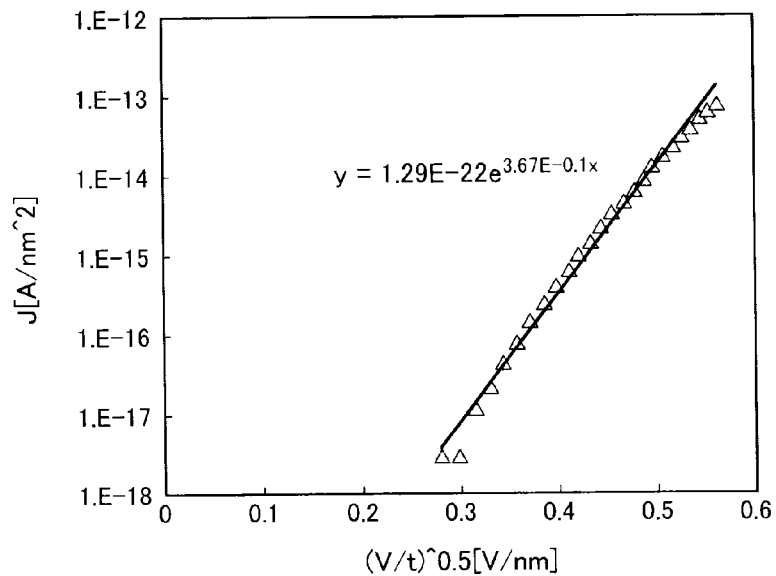
FIG. 11 is a graph showing a relationship between current density and voltage characteristics in a Si layer of the semiconductor memory device according to the second embodiment.

FIG. 11 is a graph showing a relationship between current density and voltage characteristics in the Si layer. The horizontal axis and the vertical axis show, respectively, a power of 0.5 of applied voltage per unit thickness ($(V/t)^{0.5}$ [V/nm]) and current density (J [A/nm$^2$]). From the graph, the current density in the Si layer is defined by the following expression.

[Expression 1]

$$J = 1.29 \times 10^{-22} \times \exp\left(36.7 \times \sqrt{\frac{V}{t_{si}}}\right) \quad \text{(Expression 1)}$$

$t_{si}$ is a thickness [nm] of the Si layer. V is a voltage [V] provided to an element and is equal to an amplitude of the voltage pulse. From Expression 1, a resistance value R [Ω] of the Si layer when provided with the voltage pulse, in the case that element area is S [nm²], is defined by the following expression.

[Expression 2]

$$R = \frac{V}{I} = \frac{V}{S \times 1.29 \times 10^{-22} \times \exp\left(36.7 \times \sqrt{\frac{V}{t_{si}}}\right)} \quad \text{(Expression 2)}$$

On the other hand, in the case that a film thickness of the resistance varying layer positioned below the Si layer (SiO₂ layer 32 in the present embodiment) is $t_1$ [nm], a capacitance C [F] of that resistance varying layer is defined by the following expression. Note that $\varepsilon_i$ is a relative permittivity of the resistance varying layer, and in the case of SiO₂, $\varepsilon$=3.9.

[Expression 3]

$$C = \frac{S \times 10^{-18} \times 8.85 \times 10^{12} \times \varepsilon_i}{t_1 \times 10^{-9}} \quad \text{(Expression 3)}$$

Now, the rise time of the first voltage pulse P1 for forming the filament in the Si layer 34, in the case that a capacitance value of the first resistance varying layer (SiO₂ layer 32) is assumed to be C [F] and a resistance value of the second resistance varying layer (Si layer 34) is assumed to be R[Q], is preferably shorter than R×C [s]. Specifically, a value of R×C is defined by the following expression.

[Expression 4]

$$R \times C = \frac{68.6 \times V \times \varepsilon_i}{t_1 \times \exp\left(36.7 \times \sqrt{\frac{V}{t_{si}}}\right)} \quad \text{(Expression 4)}$$

As described above, due to the semiconductor memory device according to the second embodiment, the control circuit applies to the memory cell MC a steep first voltage pulse P1 having a rise time which is shorter than R×C. As a result, the Si layer 34 which is low resistance can have a voltage sufficient for filament formation applied thereto during application of the first voltage pulse P1. As a result, the setting operation (write operation) can be performed efficiently in the stacked type memory cell MC. Moreover, filament formation at a comparatively low voltage is enabled, hence destruction of an element due to application of a high voltage can be suppressed.

Figure 12:
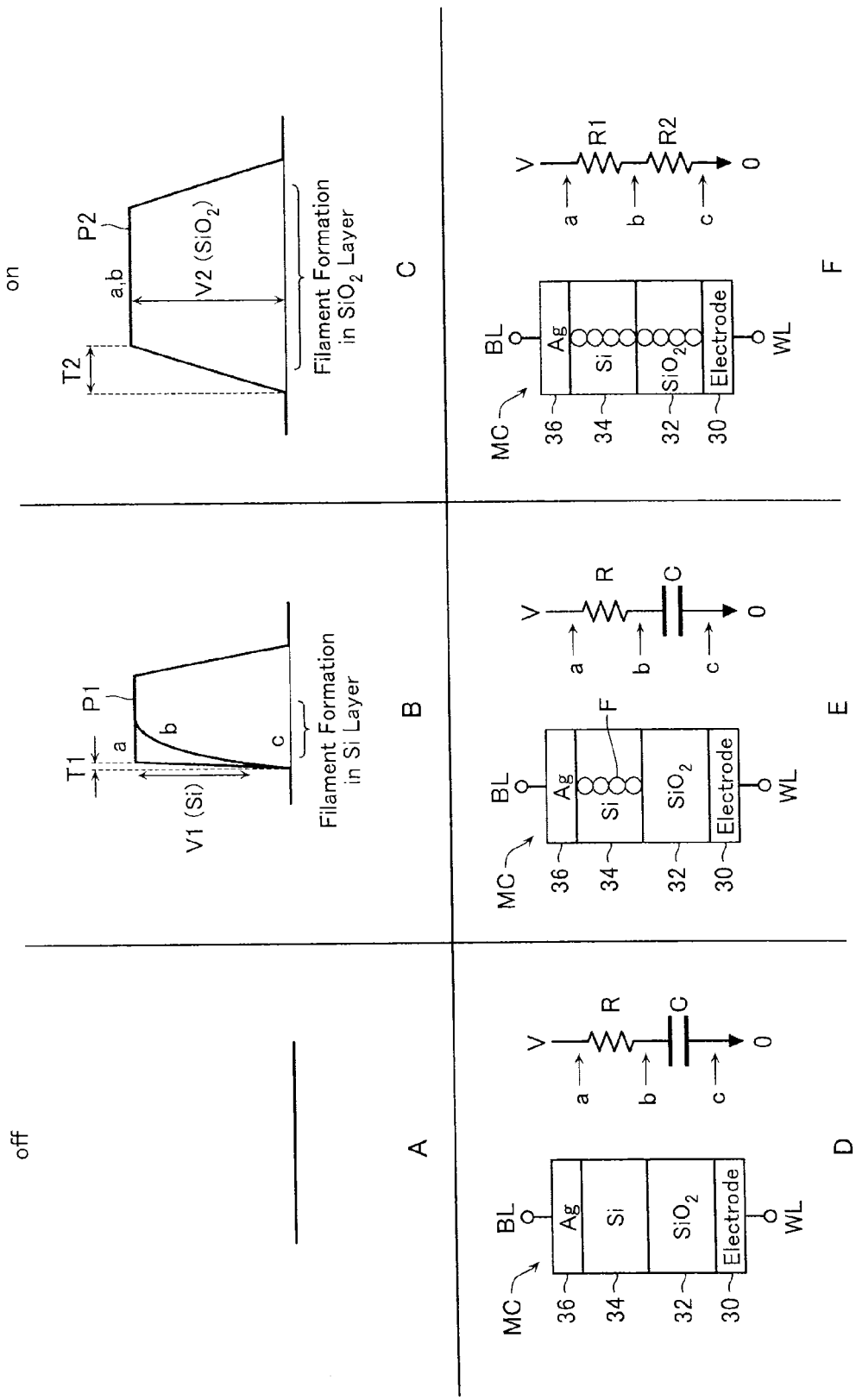
FIG. 12 includes views showing a method of application of a voltage pulse according to a first modified example of the semiconductor memory device according to the second embodiment.

FIG. 12 includes views showing a method of application of a voltage pulse according to a first modified example in the second embodiment. FIGS. 12"A" to "C" are waveform diagrams showing a change in potential at each of nodes (a, b, and c) in the memory cell MC during voltage pulse application, and FIGS. 12"D" to "F" each include a schematic diagram and an equivalent circuit diagram showing a state of the memory cell MC during the voltage pulse application. Up to application of the first voltage pulse P1 shown in FIGS. 12"A" to "B" and 12"D" to "E" is substantially shared with the second embodiment shown in FIG. 10, hence a detailed description thereof will be omitted.

As shown in FIG. 12"C", in the first modified example, the control circuit, after having applied the first voltage pulse P1 to the memory cell MC, applies the second voltage pulse P2 to the memory cell MC. The rise time T2 of the second voltage pulse P2 is longer compared to the rise time T1 of the first voltage pulse P1. In this case, as shown in FIG. 12"E", substantially all of the voltage of the second voltage pulse P2 is distributed to the SiO₂ layer 32 (between the nodes b and c). As a result, as shown in FIG. 12"F", formation of the filament F is performed in the SiO₂ layer 32, and the SiO₂ layer 32 has its resistance lowered.

Due to the first modified example in the second embodiment, the control circuit, after having applied the first voltage pulse P1, performs application of the second voltage pulse P2 having a rise time which is long, thereby enabling formation of the filament in the SiO₂ layer 32 to be more reliably performed. Note that formation of the filament need not be performed in the SiO₂ layer 32 during application of the first voltage pulse P1, hence preferably the pulse width of the first voltage pulse P1 is reduced and the write time shortened.

Figure 13:
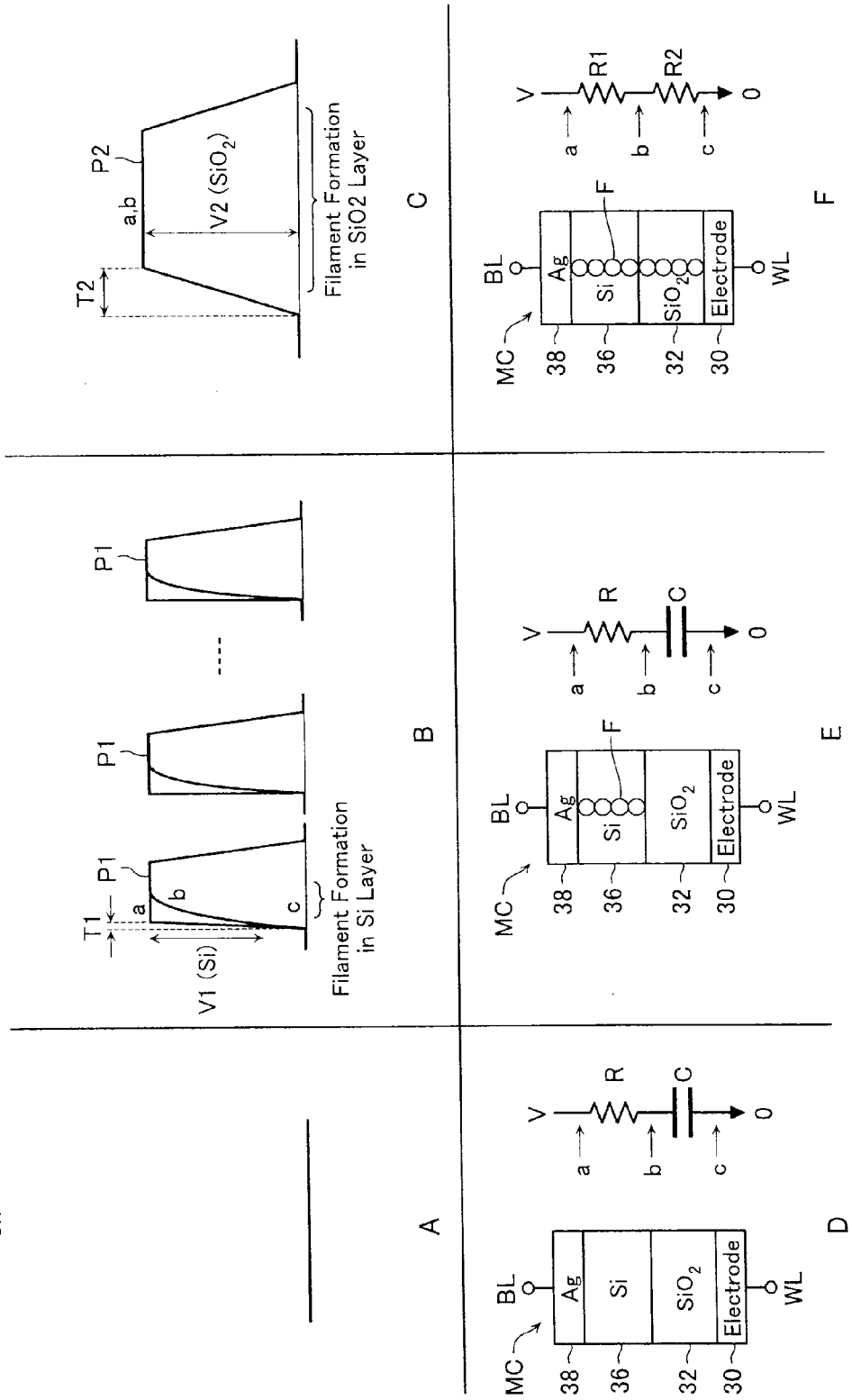
FIG. 13 includes views showing a method of application of a voltage pulse according to a second modified example of the semiconductor memory device according to the second embodiment.

FIG. 13 includes views showing a method of application of a voltage pulse according to a second modified example in the second embodiment. FIGS. 13"A" to "C" are waveform diagrams showing a change in potential at each of nodes (a, b, and c) in the memory cell MC during voltage pulse application, and FIGS. 13"D" to "F" each include a schematic diagram and an equivalent circuit diagram showing a state of the memory cell MC during the voltage pulse application. A detailed description of a portion shared with the first modified example shown in FIG. 12 will be omitted.

As shown in FIG. 13"B", in the second modified example, the control circuit applies the first voltage pulse P1 a plurality of times, successively, to the memory cell MC. Now, "successively" refers to successive application of the first voltage pulse P1 only, without application of a voltage pulse of another waveform being sandwiched in between. At this time, the first voltage pulse P1 need only have a voltage and pulse width enabling the filament to be formed in the Si layer 34, and need not have a pulse width sufficient for forming the filament in the SiO₂ layer 32. In other words, the pulse width of the first voltage pulse P1 in the second modified example may be shorter than the pulse width of the first voltage pulse P1 in the second embodiment and the first modified example.

Due to the second modified example in the second embodiment, the control circuit applies the first voltage pulse P1 a plurality of times, successively, thereby enabling formation of the filament in the Si layer 34 to be more reliably performed.

FIG. 14 includes views showing a memory cell according to a third modified example in the second embodiment. Only a configuration of the memory cell MC related to the resistance varying layers is shown, and illustration of other configurations is omitted. The second embodiment employed, respectively, the SiO₂ layer 32 as an example of the first resistance varying layer, and the Si layer 34 as an example of the second resistance varying layer, but a specific form of the memory cell MC is not limited to this configuration.

Figure 14A:
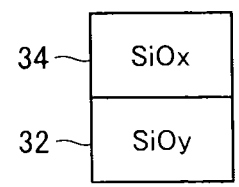
FIGS. 14A to 14C include views showing a memory cell according to a third modified example of the semiconductor memory device according to the second embodiment.

For example, as shown in FIG. 14A, it is possible to employ a SiO_y layer as the first resistance varying layer of high resistance and to employ a SiO$_x$ layer as the second resistance varying layer of low resistance. At this time, the first resistance varying layer is configured as a layer having an oxygen concentration which is higher compared to that of the second resistance varying layer, such that a relationship of "x<y" holds.

Figure 14B:
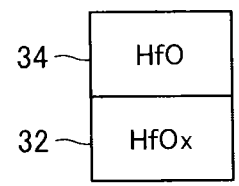
Figure 14C:
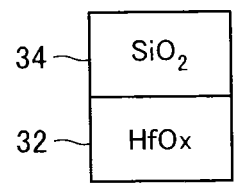

In addition, as shown in FIG. 14B, it is possible to employ hafnium (Hf) instead of silicon (Si). Furthermore, as shown in FIG. 14C, it is possible to employ a HfO$_x$ layer as the first resistance varying layer of high resistance and to employ a SiO$_2$ layer as the second resistance varying layer of low resistance. Moreover, in a memory cell MC having a stacked structure using two layers of resistance varying layers, it is also possible to employ materials other than indicated in the present embodiment and the modified examples, provided the memory cell MC is configured having the first resistance varying layer of high resistance positioned on a low potential side and the second resistance varying layer of low resistance positioned on a high potential side. Moreover, the above-described combinations of materials may also be applied to the three-layer structure type memory cell MC shown in the first embodiment.

In the first and second embodiments, a type of memory cell whose resistance value changes by formation of a filament due to Ag ions was described as an example of a memory cell employing a variable resistance element. However, the embodiments described in the present specification may be similarly applied to any semiconductor memory device that includes a memory cell which has a configuration in which variable resistance layers of different resistance values are stacked and in which a resistance value of the variable resistance layer changes by application of a voltage pulse.

Moreover, the first and second embodiments employed a Ag layer (28 and 36) as an example of the second electrode, but a configuration of the second electrode is not limited to this configuration. The second electrode may adopt a configuration including, for example, at least one of silver (Ag), nickel (Ni), cobalt (Co), aluminum (Al), zinc (Zn), titanium (Ti), tantalum (Ta), and copper (Cu).

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising a memory cell and a control circuit,
the memory cell including:
a first electrode;
a first resistance varying layer formed on the first electrode;
a second resistance varying layer formed on the first resistance varying layer and having a resistance value which is smaller than that of the first resistance varying layer;
a third resistance varying layer formed on the second resistance varying layer and having a resistance value which is larger than that of the second resistance varying layer; and
a second electrode formed on the third resistance varying layer, and
the control circuit applying to the memory cell a first voltage pulse, and then applying to the memory cell a second voltage pulse that has a polarity which is identical to that of the first voltage pulse and that has a rise time which is shorter than that of the first voltage pulse, thereby performing write of data to the memory cell.

2. The device according to claim 1, wherein
the control circuit applies the second voltage pulse a plurality of times, successively.

3. The device according to claim 1, wherein
the control circuit performs application of the first voltage pulse and the second voltage pulse such that a first electrode side is at a low potential and a second electrode side is at a high potential, and
the second electrode includes at least one of Ag, Ni, Co, Al, Zn, Ti, Ta, and Cu.

4. The device according to claim 1, wherein
the first resistance varying layer and the third resistance varying layer have an oxygen concentration which is higher compared to that of the second resistance varying layer.

5. The device according to claim 4, wherein
the second resistance varying layer includes Si.

6. The device according to claim 1, wherein
the first resistance varying layer and the third resistance varying layer include SiO2.

7. The device according to claim 1, wherein
the control circuit, after applying the second voltage pulse, applies to the memory cell a third voltage pulse that has a polarity which is identical to that of the second voltage pulse and that has a rise time which is longer than that of the second voltage pulse.

8. A semiconductor memory device comprising a memory cell and a control circuit,
the memory cell including:
a first electrode;
a first resistance varying layer formed on the first electrode;
a second resistance varying layer formed on the first resistance varying layer and having a resistance value which is smaller than that of the first resistance varying layer; and
a second electrode formed on the second resistance varying layer, and
the control circuit, when a capacitance value of the first resistance varying layer is assumed to be C and the resistance value of the second resistance varying layer is assumed to be R, applying to the memory cell a first voltage pulse that has a rise time which is shorter than R×C [s], thereby performing write of data to the memory cell;
wherein
the second resistance varying layer includes Si;
the control circuit applies the first voltage pulse a plurality of times, successively.

9. A semiconductor memory device, comprising a memory cell and a control circuit,
the memory cell including:
a first electrode;
a first resistance varying layer formed on the first electrode;
a second resistance varying layer formed on the first resistance varying layer and having a resistance value which is smaller than that of the first resistance varying layer; and
a second electrode formed on the second resistance varying layer, and the control circuit, when a capacitance value of the first resistance varying layer is assumed to be C and the resistance value of the second resistance varying layer is assumed to be R, applying to the memory cell a first voltage pulse that has a rise time which is shorter than R×C [s], thereby performing write of data to the memory cell;

wherein the control circuit, after having applied the first voltage pulse, applies to the memory cell a second voltage pulse that has a polarity which is identical to that of the first voltage pulse and that has a rise time which is longer than that of the first voltage pulse.

10. A semiconductor memory device, comprising a memory cell and a control circuit, the memory cell including:

a first electrode;

a first resistance varying layer formed on the first electrode;

a second resistance varying layer formed on the first resistance varying layer and having a resistance value which is smaller than that of the first resistance varying layer; and a second electrode formed on the second resistance varying layer, and the control circuit, when a capacitance value of the first resistance varying layer is assumed to be C and the resistance value of the second resistance varying layer is assumed to be R, applying to the memory cell a first voltage pulse that has a rise time which is shorter than R×C [s], thereby performing write of data to the memory cell;

wherein the second resistance varying layer includes Si;

the control circuit applies the first voltage pulse a plurality of times, successively, wherein if it is assumed that a thickness of the first resistance varying layer is t1 [nm], a relative permittivity of the first resistance varying layer is $\epsilon 1$, a thickness of the second resistance varying layer is t2 [nm], and a magnitude of a voltage applied between the first electrode and the second electrode is V [V], then a rise time T1 of the first voltage pulse satisfies a relationship of $T1<(68.6\times V\times \epsilon 1)/(t1\times \exp(36.7\times (V/t2)^\wedge 0.5))$.

\* \* \* \* \*